United States Patent [19]

Kawai et al.

[11] Patent Number: 5,452,148
[45] Date of Patent: Sep. 19, 1995

[54] PREAMPLIFING CIRCUIT FOR A MAGNETORESISTANCE DEVICE

[75] Inventors: Takumi Kawai; Chikara Tsuchiya, both of Kawasaki, Japan

[73] Assignee: Fujitsu Limited, Kawasaki, Japan

[21] Appl. No.: 199,931

[22] Filed: Feb. 22, 1994

[30] Foreign Application Priority Data

Feb. 22, 1993 [JP] Japan .................. 5-032284

[51] Int. Cl.$^6$ .............. G11B 5/127; G11B 5/02
[52] U.S. Cl. ..................... 360/67; 360/113
[58] Field of Search ................ 360/66, 113, 67, 68, 360/46, 65, 123; 330/252, 257; 307/350, 362, 370, 371

[56] References Cited

U.S. PATENT DOCUMENTS

| | | | |
|---|---|---|---|
| 3,618,119 | 11/1970 | Rodriguez | 360/46 |
| 4,255,769 | 3/1981 | Naylor et al. | 360/65 |
| 4,280,158 | 7/1981 | de Niet | 360/113 |
| 4,381,487 | 4/1983 | Erickson | 330/252 X |
| 4,542,422 | 9/1985 | Namiki | 360/67 |
| 4,706,138 | 11/1987 | Jove et al. | 360/67 |
| 4,786,993 | 11/1988 | Jove et al. | 360/67 |
| 4,879,610 | 11/1989 | Jove et al. | 360/67 |
| 5,122,915 | 6/1992 | Klein et al. | 360/67 X |

FOREIGN PATENT DOCUMENTS 59-33616 2/1984 Japan .
59-104720 6/1984 Japan .
62-245503 10/1987 Japan .
63-9002 1/1988 Japan .

*Primary Examiner*—Donald Hajec
*Assistant Examiner*—Thien Minh Le
*Attorney, Agent, or Firm*—Staas & Halsey

[57] ABSTRACT

A preamplifying circuit to amplify signals detected by a magnetoresistance device for a magnetic head. Two terminals of the magnetoresistance device are connected via a first resistor to a power source line Vcc and via a second resistor to a current input terminal of a constant current source having an output terminal which is connected to a ground line, respectively. A first capacitor is connected between the power source line Vcc and an input terminal of the constant current source. The two terminals of the magnetoresistance device are connected to bases of first and second transistors, respectively, in a differential amplification circuit. With this, because the input impedances at both terminals of the magnetoresistance device are equal, the external noise added to both of the terminals of the magnetoresistance device via parasitic capacitance become inphase. Also, the noise from the constant current source added to the base of the second transistor via the second resistor and the noise from the constant current source added to the base of the first transistor via the first capacitor and the first resistor become in-phase.

25 Claims, 8 Drawing Sheets

PREAMPLIFING CIRCUIT FOR A MAGNETORESISTANCE DEVICE

BACKGROUND OF THE INVENTION

The present invention relates to a preamplifying circuit that amplifies signals detected by a magnetoresistance device for a magnetic head.

As the recording density required for hard disks becomes ever higher, higher performance for magnetic heads is much desired and the use of a magnetoresistance device in the magnetic head is regarded as a very promising possibility. Since the signals detected by a magnetoresistance device are weak, the need for a preamplifying circuit with low noise and high gain has arisen.

FIG. 8 shows a prior art preamplifying circuit for a magnetoresistance device.

A signal detected by magnetoresistance device 10 is amplified in the differential amplification circuit 20. Since it is necessary to run a continuous bias current through the magnetoresistance device 10, one of its terminals is connected to the ground line via the constant current source 11. The other terminal of the magnetoresistance device 10 is connected to the power source line Vcc via the resistor 12. This resistor 12 is a means for applying a bias voltage to the base of the transistor 21 of the differential amplification circuit 20. The magnetic detection circuit is comprised of the resistor 12, the magnetoresistance device 10 and the constant current source 11.

In the differential amplification circuit 20, the transistor 21 is connected at its collector through the resistor 22 to the power source line Vcc, at its base to one terminal of the magnetoresistance device 10 and at its emitter through the constant current source 23 to the ground line. Likewise, the transistor 24 is connected at its collector through the resistor 25 to the power source line Vcc, at its base to the other terminal of the magnetoresistance device 10 and at its emitter through the constant current source 26 to the ground line. A capacitor 27 is connected between the emitter of the transistor 21 and the emitter of the transistor 24 to AC-couple them. A pair of output voltages *Vo and Vo are taken from the collectors of the transistor 21 and 24, respectively, and are further amplified in a differential amplification circuit (not shown).

With the above structure, since the current amplification factor $h_{FE}$ of the transistor 21 is sufficiently large and the base currents of the transistor 21 and 24 are insignificant in comparison with the lead-in current $I_1$ of the constant current source 11, a constant electric current $I_1$ runs through the magnetoresistance device 10. When magnetic flux transmitted through the magnetoresistance device 10 changes, the resistance of the magnetoresistance device 10 changes by $\Delta R$ and with this, the voltage between the terminals in the magnetoresistance device 10 changes by $\Delta V_i = I_1 \Delta R$ and this is amplified in the differential amplification circuit 20.

In FIG. 8, apart from the magnetoresistance device 10, all the components 11–26 and the above-described differential amplification circuit (not shown in the figure) are constituted as an integrated semiconductor circuit.

Since the detected signal in the magnetoresistance device 10 is weak, the external noise 50 presents a problem. This external noise 50 is added to one terminal of the magnetoresistance device 10 via the parasitic capacitance 51 and is also added to the other terminal of the magnetoresistance device 10 via the parasitic capacitance 52. The parasitic capacitances 51 and 52 are regarded as having the same value and, therefore, the external noise 50 is applied to the base of the transistor 21 and to the base of the transistor 24 and is considered to be in-phase. As the differential amplification circuit 20 amplifies the difference between a pair of input signals, it does not amplify this in-phase signal.

However, as input impedance of one terminal of the magnetoresistance device 10 is different from that of the other terminal, the external noise added to the base of the transistor 21 and the external noise added to the base of the transistor 24 are not in phase, resulting in a reduced signal-to-noise (SN) ratio when amplified in the differential amplification circuit 20. Also, as the current input end of the constant current source 11 is connected to the base of the transistor 24, the noise from the constant current source 11 is also amplified in the differential amplification circuit 20, causing the SN ratio to be further reduced.

SUMMARY OF THE INVENTION

Accordingly, an object of the present invention is to provide a preamplifying circuit for a magnetoresistance device wherein the SN ratio can be improved.

According to a first aspect of the present invention, there is provided a preamplifying circuit for a magnetoresistance device, comprising: a first resistor one end of which is connected to a first power source line and another end of which is connected to one end of the magnetoresistance device; a second resistor one end of which is connected to another end of the magnetoresistance device, resistance of the second resistor being substantially equal to that of the first resistor; a constant current source having a current input end which is connected to the second resistor and a current output end which, is connected to a second power source line to which a lower potential than that of the first power supply line is supplied; a capacitor connected between the first power source line and the the other end of the second resistor; the first resistor, the second resistor, the constant current source and the capacitor forming a magnetic detection circuit, and a differential amplification circuit having a pair of transistors for amplifying an alternating component of an input voltage between the ends of the magnetoresistance device, the input voltage being supplied to bases of the pair of transistors and the amplified voltage being output from collectors of the pair of transistors.

According to the first aspect of the present invention, the external noise added via a parasitic capacitance to the base of one transistor in the differential amplification circuit and the external noise added via the parasitic capacitance to the base of another transistor in the differential amplification circuit via a parasitic capacitance become in phase. Also, the signal added to the base of the one transistor by the noise from the constant current source via the second resistor and the signal added to the base of the other transistor by the noise from the constant current source via the capacitor and the first resistor become in phase since the input impedances at one and another ends of the magnetoresistance device are substantially the same as each other. Therefore, the SN ratio of the output of the differential amplification circuit is much improved.

According to a second aspect of the present invention, there is provided a preamplifying circuit for a magnetoresistance device, comprising: a first resistor one end of which is connected to a first power source line and another end of which is connected to one end of the magnetoresistance device; a second resistor one end of which is connected to another end of the magnetoresistance device, a resistance of the second resistor being substantially equal to that of the first resistor; a constant current source a current input end which is connected to the second resistor and a current output end which is connected to a second power source line to which a lower potential than that of the first power supply line is supplied; a first capacitor connected between the second power source line and the other end of the second resistor; a second capacitor connected between the first power source line and the second power source line; the first resistor, the second resistor, the constant current source, the first capacitor and the second capacitor defining a magnetic detection circuit, and a differential amplification circuit having a pair of transistors for amplifying an alternating component of an input voltage between the ends of the magnetoresistance device, the input voltage being supplied to bases of the pair of transistors and the amplified voltage being output from collectors of the pair of transistors.

According to the second aspect of the present invention, the external noise added via a parasitic capacitance to the base of one transistor in the differential amplification circuit and the external noise added via a parasitic capacitance to the base of another transistor in the differential amplification circuit via a parasitic capacitance become in phase. Also, the signal added to the base of the one transistor by the noise from the constant current source via the second resistor and the signal added to the base of the other transistor by the noise from the constant current source via the first and second capacitors and the first resistor become in phase since the input impedances at one and another ends of the magnetoresistance device are substantially the same as each other. Moreover, part of the noise from the constant current source is absorbed at the first capacitor. Therefore, the SN ratio of the output of the differential amplification circuit is much improved.

The preamplify circuits according to either the first or second aspect of the invention further comprises first switching means connected between the first power source line and the one end of the first resistor.

Second switching means is connected between the other end of the second resistor and the current input end of the constant current source.

A plurality of channels, each of which comprises the first switching means, the second switching means, the first resistor, the second resistor, the magnetoresistance device and the pair of transistors as one unit, are connected in parallel, whereby both the first switching means and the second switching means are on/off controlled for each channel.

The above-described amplifying circuit is suitable for use in semiconductor integrated circuit Further a magnetic disk driver may comprise the above-described semiconductor integrated circuit.

Detail and other features of the present invention will become apparent from the following description of the preferred embodiments when the same is read in conjunction with the accompanying drawings.

DESCRIPTION OF THE PREFERRED EMBODIMENT

Figure 1:
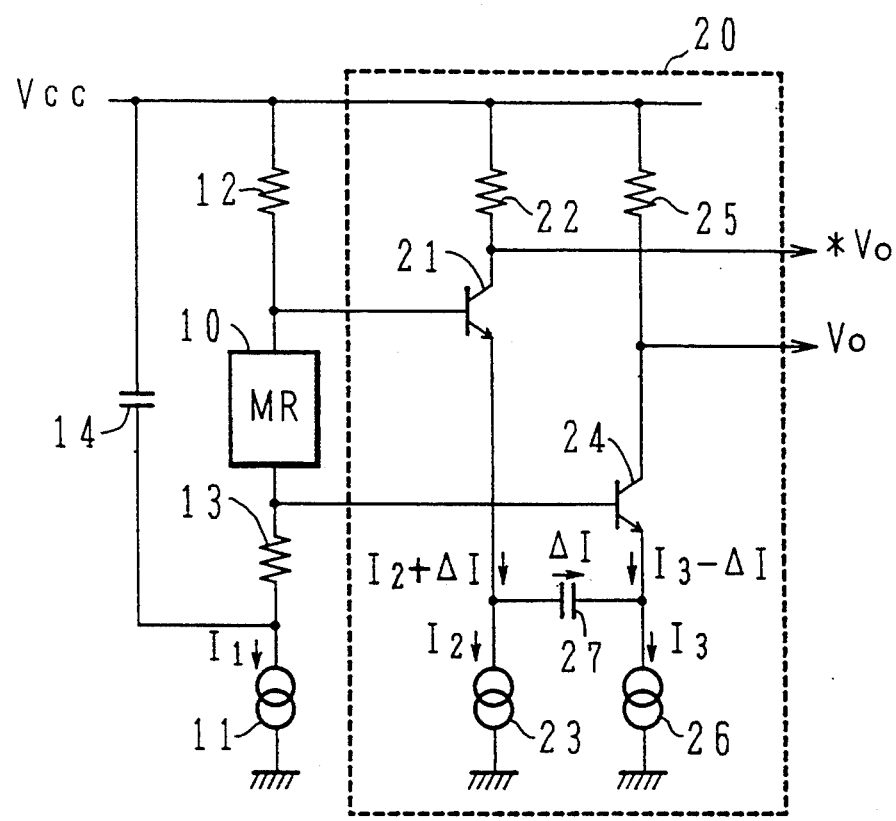
FIG. 1 is a circuit diagram of a first embodiment of a preamplifying circuit for a magnetoresistance device according to the present invention.
Figure 8:
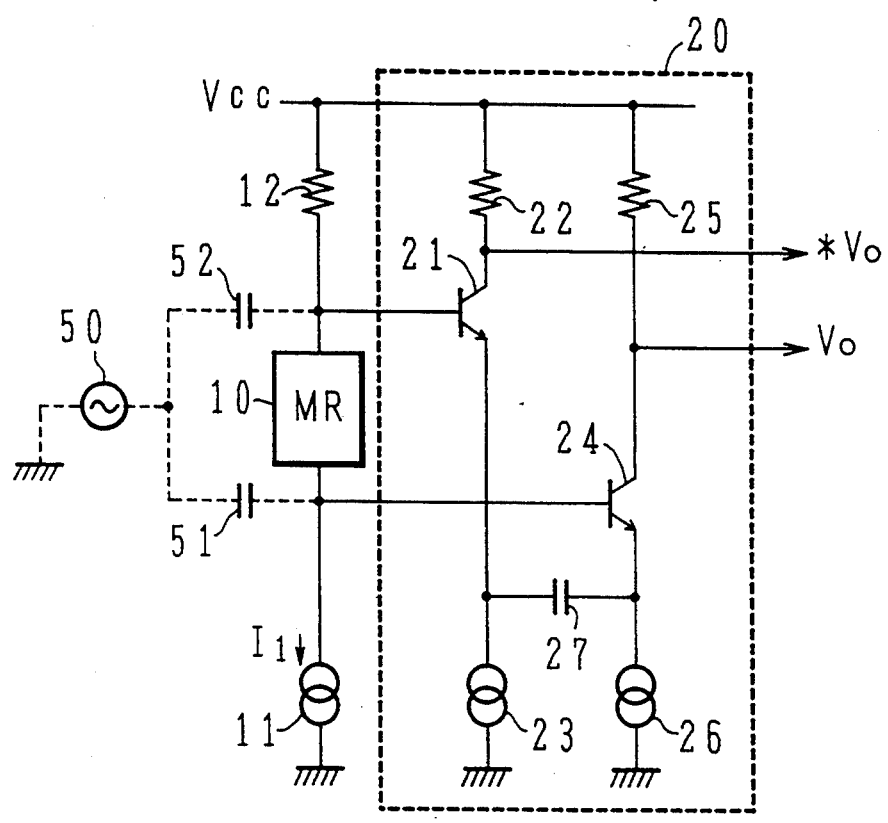
FIG. 8 is a circuit diagram of a prior art preamplifing circuit for a magnetoresistance device.

FIG. 1 shows a first embodiment of the preamplifying circuit for a magnetoresistance device according to the present invention. Hereafter, components identical to those in FIG. 8 are designated with the same reference characters and an explanation of those components is omitted.

The currents running through the constant current sources 23 and 26 are $I_2$ and, respectively. When the resistance of the magnetoresistance device 10 is constant, the emitter current of the transistor 21 is $I_2$ and the emitter current of the transistor 24 is $I_3$. When the resistance of the magnetoresistance device 10 increases with an increase in the transmitted magnetic flux, the base potential of the transistor 21 increases and the emitter current of the transistor 21 becomes $I_2+\Delta I$ and the emitter current of the transistor 24 becomes $I_3-\Delta I$ with an electric current $\Delta I$ running through the capacitor 27 in the direction indicated by the arrow in the figure. For example, when $I_2=I_3$ and the resistances of resistor 22 and 25 are the same at R, $Vo-*Vo=2\ \Delta IR$. Since the differential amplification circuit 20 only amplifies the alternating component of the difference between a pair of input signals, it does not amplify in-phase signals.

However, if the input impedance at one terminal of the magnetoresistance device 10 is different from that at the other terminal, the external noise added to the base of the transistor 21 and the external noise added to the base of the transistor 24 are not in phase, resulting in a reduced SN ratio when amplified in the differential amplification circuit 20. The same thing happens with the noise from the constant current source 11.

Thus, in the magnetic detection circuit for preamplifying circuit, a resistor 13 With resistance equal to that of resistor 12 is connected between one terminal of the magnetoresistance device 10 and the current input terminal of the constant current source 11, and a capacitor 14 is connected between the power source line Vcc and the current input terminal of the constant current source 11.

With this, since the input impedance at one terminal of the magnetoresistance device 10 is the same as that at the other terminal, the external noise added to the base of the transistor 21 via the parasitic capacitance and the external noise added to the base of the transistor 24 via the parasitic capacitance are in phase. Also, the noise added to the base of the transistor 24 from the constant current source 11 via the resistor 13 and the noise added to the base of the transistor 21 from the constant current source 11 via the capacitor 14 and the resistor 12 are in phase. Therefore, the SN ratio of the output of the differential amplification circuit 20 is much improved.

Figure 2:
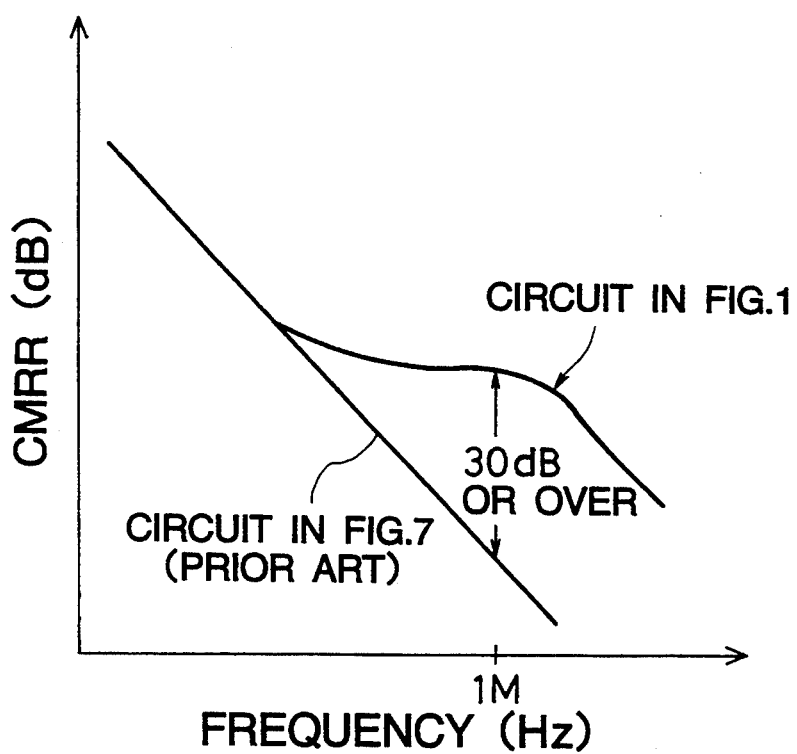
FIG. 2 is a diagram illustrating a comparison of a common mode signal rejection ratio against frequency of the circuit illustrated in FIG. 1 and the circuit illustrated in FIG. 8.

In an actual instance, with the resistance for both the resistor 12 and the resistor 13 set at 40 Ω, the capacitance of the capacitor 14 set at 0.1 μF and the resistance of the magnetoresistance device 10 set at 15 Ω, the common mode rejection ratio (CMRR) was measured. The results were as shown in FIG. 2. With the frequency at 1 MHz, CMRR was improved compared to the circuit shown in FIG. 8 by approximately 30 dB.

Figure 3:
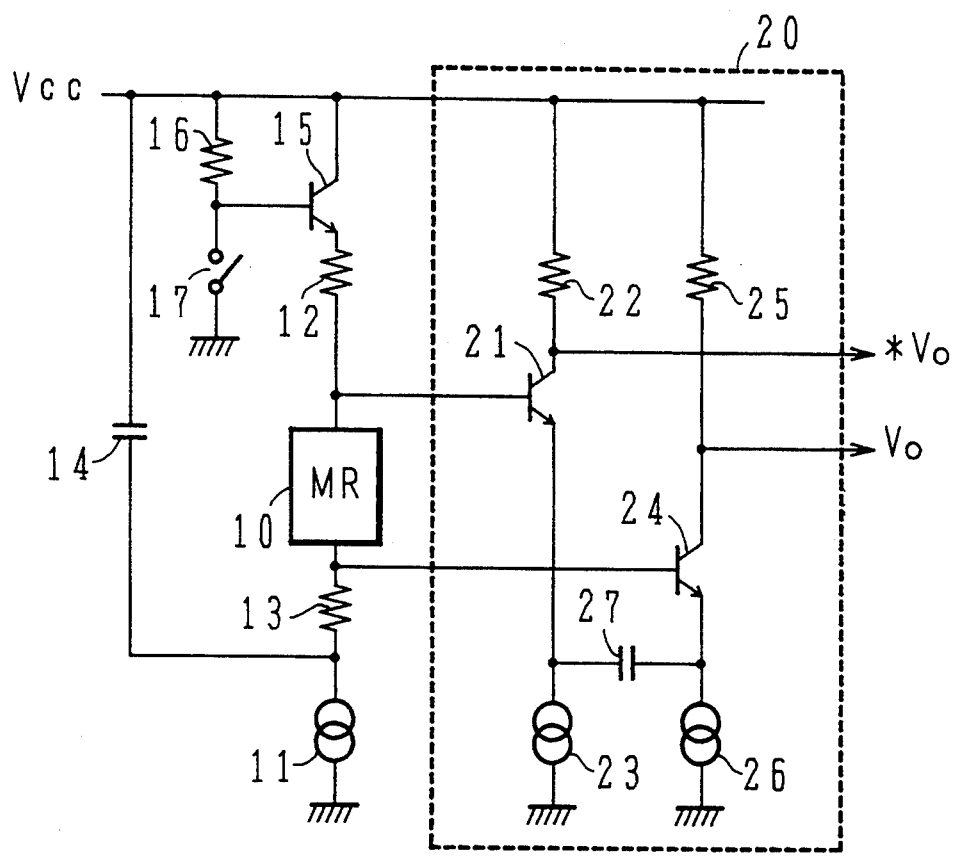
FIG. 3 is a circuit diagram of a second embodiment of a preamplifying circuit for a magnetoresistance device according to the present invention.

FIG. 3 shows a second embodiment of a preamplifying circuit for a magnetoresistance device according to the present invention.

This preamplifying circuit is provided with a transistor 15 connected between the resistor 12 and the power source line Vcc so that the electric current running through the magnetoresistance device 10 can be turned on and off in the magnetic detection circuit. In other words, the transistor 15 is connected at its collector to the power source line Vcc, at its emitter to one end of the resistor 12 and at its base to the power source line Vcc via the resistor 16. A switching device 17 is connected between the base of the transistor 15 and a ground line. In this case, it is necessary to increase the resistance of the resistor 13 according to the emitter impedance of the transistor 15 so as to equalize the input impedances at one terminal and the other terminal of the magnetoresistance device 10.

All of the other aspects of this embodiment are identical to the embodiment shown in FIG. 1.

With the structure described above, when the switching device 17 is turned off, the transistor 15 is set to on, which sets the magnetoresistance device 10 in the operating state and when the switching device 17 is turned on, the transistor 15 is set to off, which sets the magnetoresistance device 10 into the non-operating state.

Figure 4:
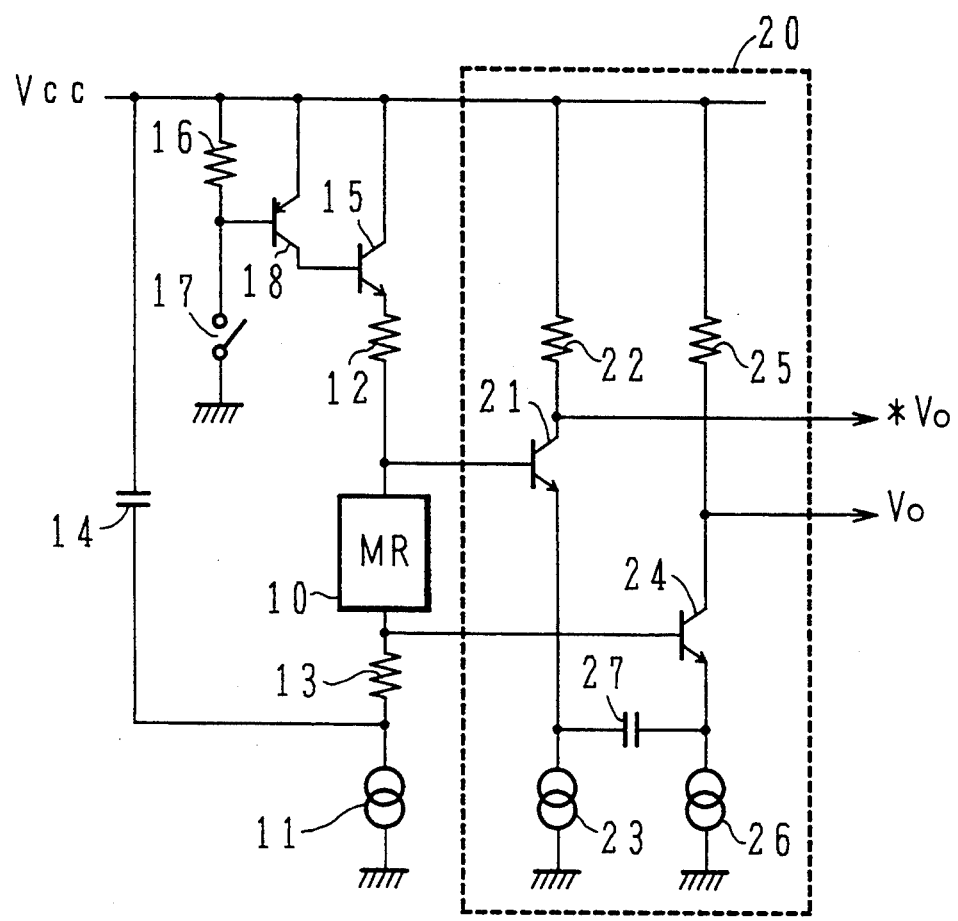
FIG. 4 is a circuit diagram of a third embodiment of a preamplifying circuit for a magnetoresistance device according to the present invention.

FIG. 4 shows a third embodiment of a preamplifying circuit for a magnetoresistance device according to the present invention. Components identical to those shown in FIG. 3 are designated with the same reference characters, and an explanation of those components is omitted.

Instead of the single transistor 15 shown in FIG. 3, this preamplifying circuit is provided with a transistor 15 and a transistor 18 which are darlington-connected. Transistor 18 enters the saturated state when ON.

In this embodiment also, it is necessary to increase the resistance of the resistor 13 by a value equivalent to the emitter impedance of the transistor 15 in order to equalize the input impedance at both terminals of the magnetoresistance device 10. However, the emitter impedance of the transistor 15 is 1/h$_{FE}$ of the ON resistance of the saturated transistor 18, so it is insignificant and may be disregarded, independent of the inconsistent characteristics of the transistors 15 and 18. This means that the resistances of the resistors 12 and 13 can be equalized each other.

All other aspects of this embodiment are identical to the embodiment shown in FIG. 3.

Figure 5:
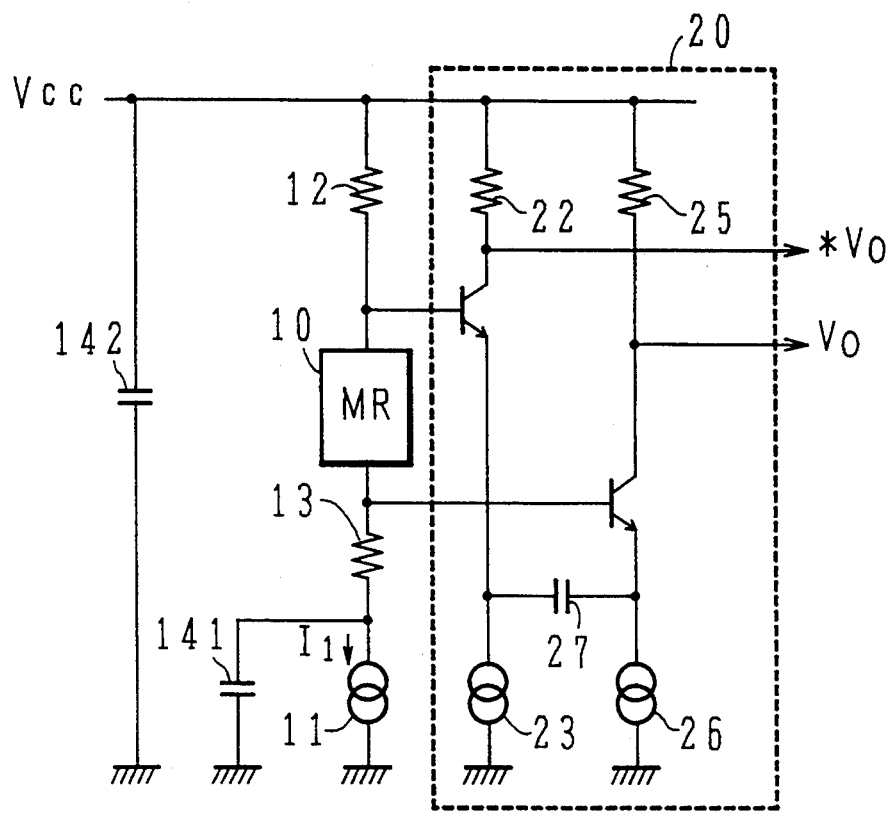
FIG. 5 is a circuit diagram of a fourth embodiment of a preamplifying circuit for a magnetoresistance device according to the present invention.

FIG. 5 shows a fourth embodiment of preamplifying circuit for a magnetoresistance device according to the present invention. Components identical to those shown in FIG. 1 are designated with the same reference characters, and an explanation of those components is omitted.

This preamplifying circuit is provided, in the magnetic detection circuit, with the capacitor 141 connected between the current input terminal of the constant current source 11 and the ground line and the capacitor 142 connected between the power source line Vcc and the ground line instead of the capacitor 14 as shown in FIG. 1. The capacitances of capacitor 141 and 142 are the same.

All other aspects of this embodiment are identical to the embodiment shown in FIG. 1.

With the resistor 13 and the capacitor 141 connected in series, and the resistor 12 and the capacitor 142 connected in series, the input impedance is equal at both terminals of the magnetoresistance device 10. Also, part of the noise from the constant current source 11 is absorbed by the capacitor 141. Therefore, as in the first embodiment described above, the SN ratio of the output of the differential amplification circuit 20 is much improved.

Figure 6:
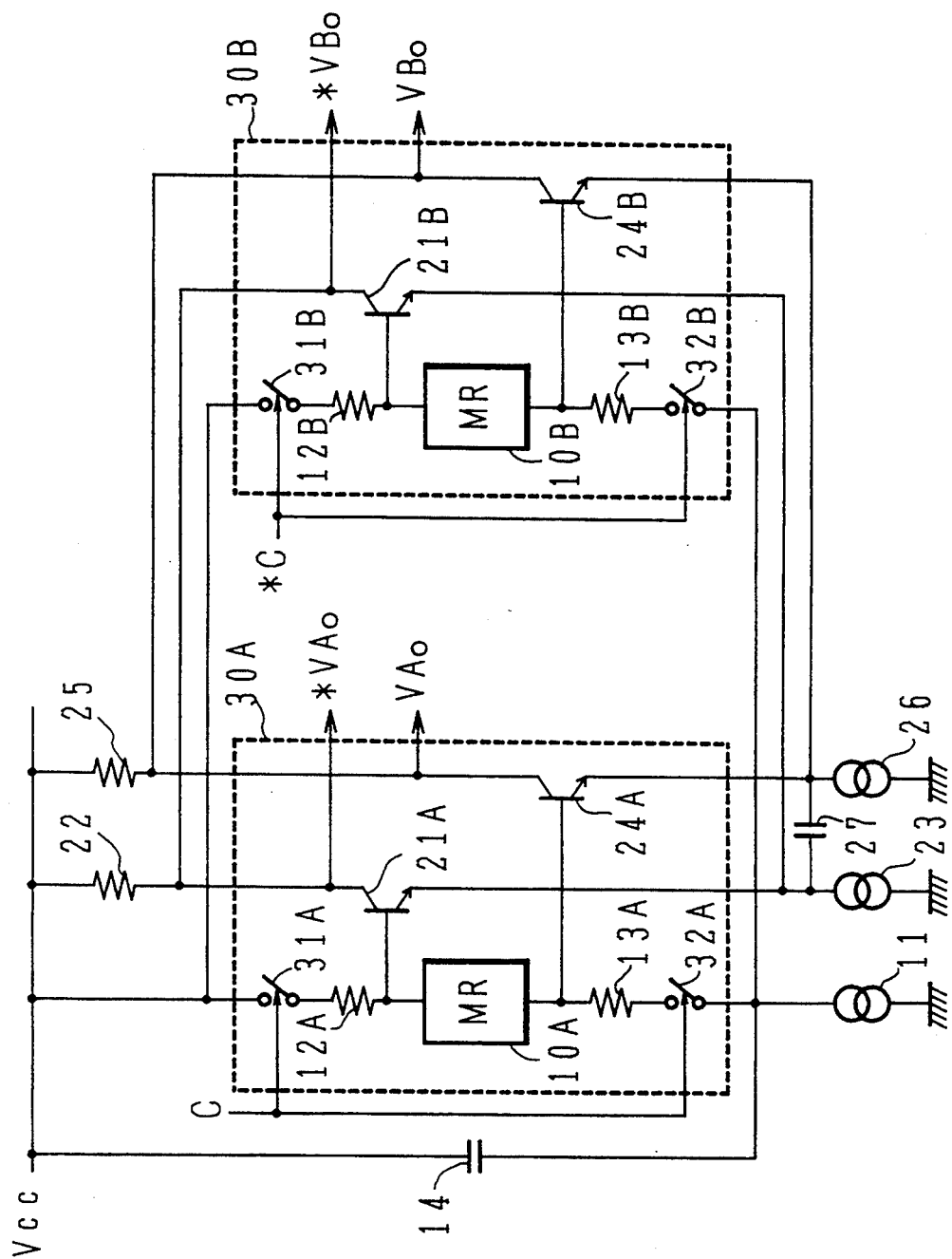
FIG. 6 is a circuit diagram of a fifth embodiment of a preamplifying circuit for a magnetoresistance device according to the present invention.

FIG. 6 shows a fifth embodiment of the preamplifying circuit for a magnetoresistance device according to the present invention. Components identical to those shown in FIG. 1 are designated with the same reference characters, and an explanation of those components is omitted.

This preamplifying circuit is provided with two identically structured channels, the first channel 30A and the second channel 30B, which are connected in parallel to use the two magnetoresistance devices 10A and 10B by switching. In FIG. 6, the corresponding components of the first channel 30A and the second channel 30B are designated with like reference characters (with the exception of ending with an "A" and a "B", respectively. A pair of outputs from the first channel 30A are expressed as VAo and *VAo. A pair of outputs from the second channel 30B are designated with VBo and *VBo.

The first channel 30A is provided with a pair of transistors 21A and 24A that constitute a differential amplification circuit, the magnetoresistance device 10A, the resistors 12A and 13A that are connected to respective terminals of the magnetoresistance device 10A, a switching device 31A that is connected between the resistor 12A and the power source line Vcc, and a switching device 32A that is connected between the resistor 13A and the input terminal of the constant current source 11. As noted above, the second channel 30B has similar connections as the first channel 30A. The resistors 22 and 25, the constant current sources 11, 23 and 26 and the capacitors 14 and 27 are commonly used by the first channel 30A and second channel 30B.

With the above structure, when both the switching devices 31A and 32A are set to on by a control signal C, both the switching devices 31B and 32B are turned off by a control signal *C that is an inverse signal of the control signal C, setting the magnetoresistance device 10A in the operating state and the magnetoresistance device 10B in the non-operating state. Likewise, when both the switching devices 31A and 32A are set to off by the control signal C, both the switching devices 31B and 32B are turned on by the control signal *C, setting the magnetoresistance device 10A in the non-operating state and the magnetoresistance device 10B in the operating state.

In summary, only one of the first channel 30A and the second channel 30B is in the operating state at any given time. As for noise, it is identical to the situation in the circuit shown in FIG. 1. As a result, the SN ratios of the outputs of the first channel 30A and the second channel 30B are much improved.

Figure 7:
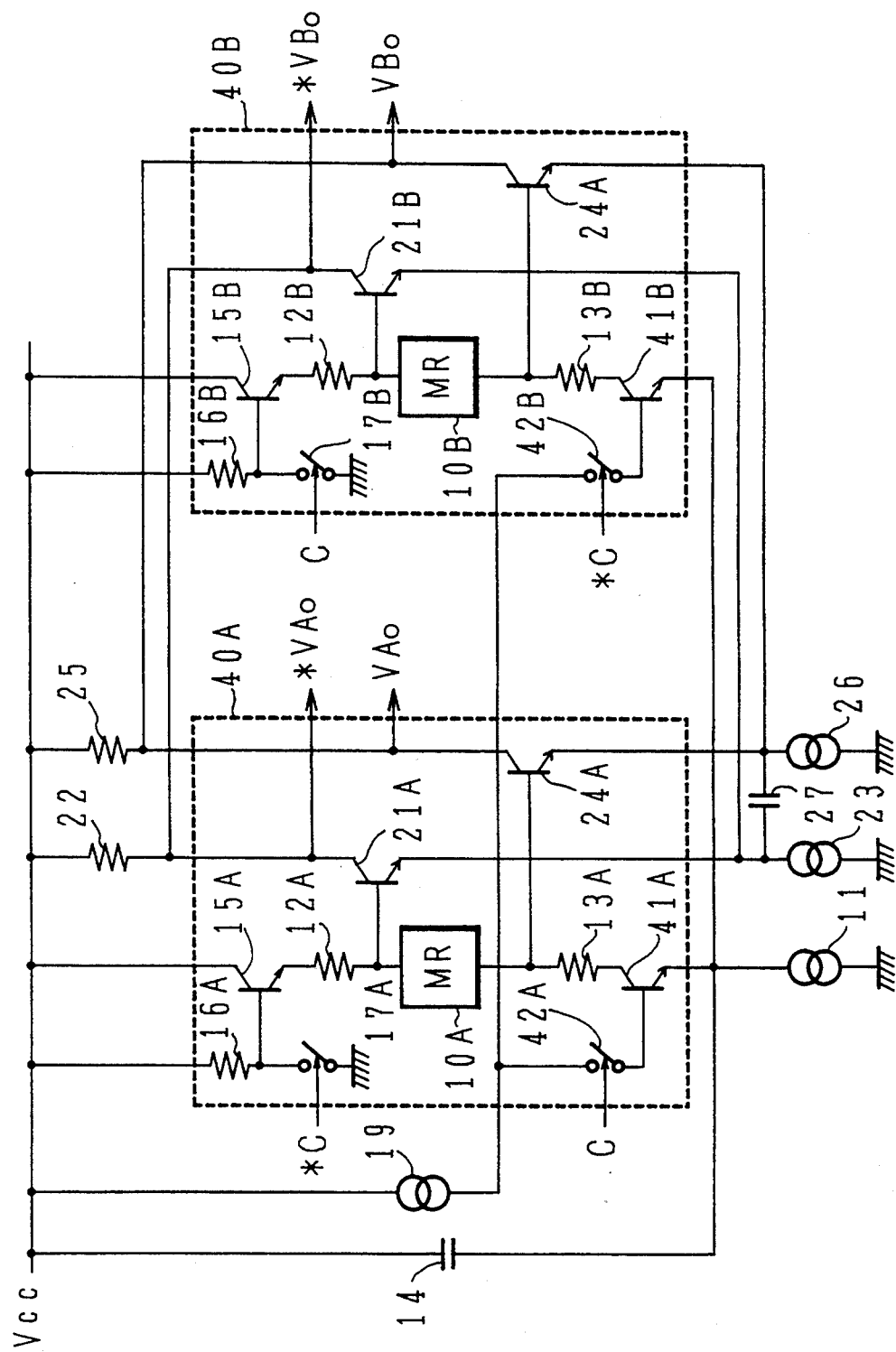
FIG. 7 is a circuit diagram of a sixth embodiment of a preamplifying circuit for a magnetoresistance device according to the present invention.

FIG. 7 shows a sixth embodiment of a preamplifying circuit for a magnetoresistance device according to the present invention. Components identical to those shown in FIG. 6 are designated with the same reference characters, and an explanation of those components is omitted.

This preamplifying circuit is provided with two identically structured channels, a first channel 40A and a second channel 40B connected in parallel to use the two magnetoresistance devices 10A and 10B by switching. In FIG. 7, the corresponding components of the first channel 40A and the second channel 40B are designated with like reference characters (with the exception of ending with an "A" and a "B", respectively). A pair of Outputs from first channel 40A are designated with VAo and *VAo and a pair of outputs from the second channel 40B are designated with VBo and *VBo.

The first channel 40A is provided with switching devices identical to the switching devices 31A and 32A shown in FIG. 6 that are constituted with transistor 15A and transistor 41A respectively, as in the embodiment shown in FIG. 3. The base of transistor 15A is connected to the power source line Vcc via the resistor 16A. The switching device 17A is connected between the base of the transistor 15A and the ground line. One end of the switching device 42A is connected to the base of the transistor 41A and the other end of the switching device 42A is connected to the power source line Vcc via the constant current source 19 that is commonly used by the first channel 40A and the second channel 40B. The constant current source 19 supplies a base current to turn the transistor 41A or the transistor 41B ON in a saturated state.

All other aspects of the sixth embodiment are identical to the embodiment shown in FIG. 6.

With the above structure, when the switching devices 42A and 17B are set to ON by the control signal C, and the switching devices 17A and 42B are set to OFF by the control signal *C, both the transistor 15A and the transistor 41A are set to ON and both the transistor 15B and the transistor 41B are set to OFF at the same time, setting the first channel 40A in the operating state and the second channel 40B in the non-operating state. Likewise, when the switching devices 42A and 17B are set to OFF by the control signal C and the switching devices 17A and 42B are set to ON by the control signal *C, both the transistors 15A and 41A are turned OFF and both the transistors 15B and 41B are turned ON at the same time, setting the first channel 40A in the non-operating state and the second channel 40B in the operating state.

In summary, only one of either the first channel 40A or the second channel 40B is in the operating state at any given time. As for noise, it is identical to the situation in the circuit shown in FIG. 1. As a result, the SN ratio of the output from first channel 40A and the second channel 40B is much improved.

Having described specific embodiments of the present invention, it is to be understood that modifications and variations of the invention are possible without departing from the spirit and scope thereof.

What is claimed is:

1. A preamplifying circuit, connected between first and second power source lines, for a magnetoresistance device having first and second ends, said preamplifying circuit comprising:
    a first resistor having a first end connected to the first power source line and a second end connected to the first end of the magnetoresistance device;
    a second resistor having a first end connected to the second end of the magnetoresistance device and having a second end, a resistance of said second resistor being substantially equal to that of said first resistor;
    a first constant current source having a current input end connected to the second end of said second resistor and a current output end connected to the second power source line, the second power source line having a lower potential than that of said first power source line;
    a first capacitor connected between the first power source line and the second end of said second resistor;
    said first resistor, said second resistor, said first constant current source and said first capacitor forming a magnetic detection circuit; and
    a differential amplification circuit, having a pair of transistors, to amplify an alternating component of an input voltage between the first and second ends of the magnetoresistance device, the input voltage being supplied to respective bases of said pair of transistors and, in response, said differential amplification circuit outputting an amplified voltage from respective collectors of said pair of transistors.

2. The preamplifying circuit for a magnetoresistance device according to claim 1, further comprising first switching means connected between the first power source line and the first end of said first resistor.

3. The preamplifying circuit for a magnetoresistance device according to claim 2, further comprising second switching means connected between the second end of said second resistor and the current input end of said first constant current source.

4. The preamplifying circuit for a magnetoresistance device according to claim 3, further comprising a plurality of channels connected in parallel, each of said plurality of channels comprising said first switching means, said second switching means, said first resistor, said second resistor, said magnetoresistance device and said pair of transistors as one unit; and
    wherein both said first switching means and said second switching means are on/off controlled for each of said plurality of channels.

5. The preamplifying circuit for a magnetoresistance device according to claim 4, wherein each of said first and second switching means comprises a transistor switch.

6. A preamplifing circuit for a magnetoresistance device according to claim 4,
    wherein said first switching means comprises:
        a first NPN-type transistor having a base, a collector connected to the first power source line, and an emitter connected to the first end of said first resistor;

a third resistor having a first end connected to the first power source line and a second end connected to the base of said first NPN-type transistor; and a first switching device connected between the base of said first NPN-type transistor and the second power source line, wherein said second switching means comprises:

a second NPN-type transistor having a base, a collector connected to the second end of said second resistor, and an emitter connected to the current input end of said first constant current source;

another constant current source having a current input end connected to the first power source line, and having a current output end; and a second switching device connected between the base of said second NPN-type transistor and the current output end of said another constant current source.

7. The preamplifying circuit for a magnetoresistance device according to claim 4, wherein said differential amplification circuit comprises:

third and fourth resistors, each having a first end connected to the first power supply line;

second and third constant current sources, each having a current output end connected to the second power source line, and having a current input end;

a third capacitor connected between the current input ends of said second and third constant current sources; and said pair of transistors being of NPN-type, a first one of said pair of transistors having a collector connected to the second end of said third resistor, an emitter connected to said current input end of said second constant current source, and a base connected to the first end of the magnetoresistance device, a second one of said pair of transistors having a collector connected to the second end of said fourth resistor, an emitter connected to the current input end of said third constant current source and a base connected to the second end of the magnetoresistance device.

8. The preamplifying circuit according to claim 7, wherein said preamplifying circuit is used in a semiconductor integrated circuit.

9. The preamplifying circuit according to claim 8, wherein said semiconductor integrated circuit is used in a magnetic disk driver.

10. The preamplifying circuit according to claim 4, wherein said preamplifying circuit is used in a semiconductor integrated circuit.

11. The preamplifying circuit according to claim 10, wherein said semiconductor integrated circuit is used in a magnetic disk driver.

12. The preamplifying circuit for a magnetoresistance device according to claim 3, wherein said second switching means comprises a transistor switch.

13. The preamplifying circuit for a magnetoresistance device according to claim 3, wherein said differential amplification circuit comprises:

third and fourth resistors, each having a first end connected to the first power supply line;

second and third constant current sources, each having a current output end connected to the second power source line, and having a current input end;

a third capacitor connected between the current input ends of said second and third constant current sources; and said pair of transistors being of NPN-type, a first one of said pair of transistors having a collector connected to the second end of said third resistor, an emitter connected to said current input end of said second constant current source, and a base connected to the first end of the magnetoresistance device, a second one of said pair of transistors having a collector connected to the second end of said fourth resistor, an emitter connected to the current input end of said third constant current source and a base connected to the second end of the magnetoresistance device.

14. The preamplifying circuit for a magnetoresistance device according to claim 2, wherein said first switching means comprises a transistor switch.

15. The preamplifying circuit for a magnetoresistance device according to claim 2, wherein said first switching means comprises:

an NPN-type transistor having a base, a collector connected to the first power source lien, and an emitter connected to the first end of said first resistor;

a third resistor having a first end connected to the first power source line and a second end connected to the base of said NPN-type transistor; and a switching device connected between the base of said NPN-type transistor and the second power source line.

16. The preamplifying circuit for a magnetoresistance device according to claim 2, wherein said first switching means comprises:

an NPN-type transistor having a base, a collector connected to the first power source line, and an emitter connected to the first end of said first resistor;

a PNP-type transistor having a base, an emitter connected to the first power source line, and a collector connected to the base of said NPN-type transistor;

a third resistor having a first end connected to the first power source line and a second end connected to the base of said PNP-type transistor; and a switching device connected between the base of said PNP-type transistor and the second power source line.

17. The preamplifying circuit for a magnetoresistance device according to claim 1, wherein said differential amplification circuit comprises:

third and fourth resistors, each having a first end connected to the first power supply line, and a second end;

second and third constant current sources, each having a current output end connected to the second power source line, and having a current input end;

a second capacitor connected between the current input ends of said second and third constant current sources; and said pair of transistors being of NPN-type, a first one of said pair of transistors having a collector connected to the second end of said third resistor, an emitter connected to said current input end of said second constant current source, and a base connected the first end of the magnetoresistance device, a second one of said pair of transistors having a collector connected to the second end of said fourth resistor, an emitter connected to the current input end of said third constant current source and a base connected the second end of the magnetoresistance device.

18. The preamplifying circuit according to claim 1, wherein said preamplifying circuit is used in a semiconductor integrated circuit.

19. The preamplifying circuit according to claim 18, wherein said semiconductor integrated circuit is used in a magnetic disk driver.

20. A preamplifying circuit, connected between first and second power source lines, for a magnetoresistance device having first and second ends, said preamplifying circuit comprising:
 a first resistor having a first end connected to the first power source line and a second end connected to the first end of the magnetoresistance device;
 a second resistor having a first end connected to the second end of the magnetoresistance device and having a second end, a resistance of said second resistor being substantially equal to that of said first resistor;
 a first constant current source having a current input end connected to the second end said second resistor and a current output end connected to the second power source line, the second power source line having a lower potential than that of the first power source line;
 a first capacitor connected between the second power source line and the second end of said second resistor;
 a second capacitor connected between the first power source line and the second power source line;
 said first resistor, said second resistor, said first constant current source, said first capacitor and said second capacitor forming a magnetic detection circuit; and
 a differential amplification circuit, having a pair of transistors, to amplify an alternating component of an input voltage between the first and second ends of the magnetoresistance device, the input voltage being supplied to respective bases of said pair of transistors and, in response, said differential amplification circuit outputting an amplified voltage from respective collectors of said pair of transistors.

21. The preamplifying circuit for a magnetoresistance device according to claim 20, wherein said differential amplification circuit comprises:
 third and fourth resistors, each having a first end connected to the first power supply line;
 second and third constant current sources, each having a current output end connected to the second power source line, and having a current input end;
 a third capacitor connected between the current input ends of said second and third constant current sources; and
 said pair of transistors being of NPN-type, a first one of said pair of transistors having a collector connected to the second end of said third resistor, an emitter connected to said current input end of said second constant current source, and a base connected to the first end of the magnetoresistance device, a second one of said pair of transistors having a collector connected to the second end of said fourth resistor, an emitter connected to the current input end of said third constant current source and a base connected to the second end of the magnetoresistance device.

22. The preamplifying circuit according to claim 20, wherein said preamplifying circuit is used in a semiconductor integrated circuit.

23. The preamplifying circuit according to claim 22, wherein said semiconductor integrated circuit is used in a magnetic disk driver.

24. A preamplifying circuit, connected between first and second power source lines, for a magnetoresistance device having first and second ends, said preamplifying circuit comprising:
 a plurality of channels connected in parallel with each other, each of said plurality of channels comprising;
 said magnetoresistance element,
 a first resistor having a first end connected to the first power source line and a second end connected to the first end of the magnetoresistance element,
 a second resistor having a first end connected to the second end of the magnetoresistance device, a resistance of said second resistor being substantially equal to that of said first resistor,
 first switching means connected between the first power source line and the first end of said first resistor,
 second switching means connected between the second end of said second resistor and a node,
 a differential amplification circuit, having a pair of transistors, to amplify an alternating component of an input voltage between the first and second ends of the magnetoresistance device, the input voltage being supplied to respective bases of said pair of transistors and, in response, said differential amplification circuit outputting an amplified voltage from respective collectors of said pair of transistors;
 a capacitor connected between said first power source line and the second end of said second resistor, and
 a constant current source having a current input end connected to the second ends of said second resistors of said plurality of channels at the node and a current output end connected to the second power source line.

25. The preamplifying circuit according to claim 24, further comprising:
 an additional capacitor having first and second ends;
 a first additional constant current source having a current input end connected to the emitters of each of first ones of said pair of transistors and the first end of said additional capacitor, and a current output end connected to the second power source line;
 a second additional constant current source having a current input end connected to the emitters of each of second ones of said pair of transistors and the second end of said additional capacitor, and a current output end connected to the second power source line;
 a third resistor having a first end connected to the first power source line and a second end connected to the collectors of each of said first ones of said pair of transistors; and
 a fourth resistor having a first end connected to the first power source line and a second end connected to the collectors of each of said second ones of said pair of transistors.

* * * * *

UNITED STATES PATENT AND TRADEMARK OFFICE
CERTIFICATE OF CORRECTION

PATENT NO. : 5,452,148
DATED : September 19, 1995
INVENTOR(S) : Takumi KAWAI et al.

It is certified that error appears in the above-indentified patent and that said Letters Patent is hereby corrected as shown below:

Column 1, in the title, and
item [54] In the Title, "PREAMPLIFING" should be –PREAMPLIFYING–.

Column 3, line 10, after "source" insert –having–;

line 46, delete "preamplify" and insert –preamplifying–;

line 63, after "further" insert –,–; and line 65, delete "Detail" and insert –Details–.

Column 4, line 37, after "and" insert –$I_3$–.

Column 6, line 41, after "respectively" insert –)–.

Signed and Sealed this

Nineteenth Day of December, 1995

Attest:

BRUCE LEHMAN

Attesting Officer  Commissioner of Patents and Trademarks